(12) United States Patent
Stössel et al.

(10) Patent No.: US 8,129,037 B2
(45) Date of Patent: *Mar. 6, 2012

(54) PHENANTHRENE DERIVATIVE

(75) Inventors: Philipp Stössel, Frankfurt am Main (DE); Arne Büsing, Frankfurt am Main (DE); Horst Vestweber, Gilserberg (DE); Holger Heil, Darmstadt (DE)

(73) Assignee: Merck Patent GmbH (DE)

( * ) Notice: Subject to any disclaimer, the term of this patent is extended or adjusted under 35 U.S.C. 154(b) by 820 days.

This patent is subject to a terminal disclaimer.

(21) Appl. No.: 11/577,055

(22) PCT Filed: Sep. 20, 2005

(86) PCT No.: PCT/EP2005/010113
§ 371 (c)(1),
(2), (4) Date: Apr. 11, 2007

(87) PCT Pub. No.: WO2006/039982
PCT Pub. Date: Apr. 20, 2006

(65) Prior Publication Data
US 2009/0026919 A1   Jan. 29, 2009

(51) Int. Cl.
*H01L 51/00* (2006.01)
*C07C 15/20* (2006.01)
*C07C 49/115* (2006.01)
*C07D 209/86* (2006.01)
*C09D 11/00* (2006.01)

(52) U.S. Cl. ........ 428/690; 428/917; 313/504; 548/446; 568/326; 585/26; 257/40

(58) Field of Classification Search .......... None
See application file for complete search history.

(56) References Cited

U.S. PATENT DOCUMENTS

| | | | |
|---|---|---|---|
| 4,539,507 A | 9/1985 | VanSlyke et al. | |
| 5,077,142 A | 12/1991 | Sakon et al. | |
| 5,151,629 A * | 9/1992 | VanSlyke | 313/504 |
| 5,648,021 A | 7/1997 | Wingen et al. | |
| 5,840,217 A | 11/1998 | Lupo et al. | |
| 5,935,721 A | 8/1999 | Shi et al. | |
| 6,458,909 B1 | 10/2002 | Spreitzer et al. | |
| 6,482,478 B1 | 11/2002 | Wingen | |
| 2003/0118866 A1* | 6/2003 | Oh et al. | 428/690 |
| 2004/0202891 A1* | 10/2004 | Ishibashi et al. | 428/690 |
| 2005/0064233 A1 | 3/2005 | Matsuura et al. | |
| 2005/0176952 A1 | 8/2005 | Tuan et al. | |
| 2005/0176953 A1 | 8/2005 | Tuan et al. | |
| 2005/0233165 A1 | 10/2005 | Ido et al. | |
| 2006/0033421 A1 | 2/2006 | Matsuura et al. | |
| 2006/0069287 A1* | 3/2006 | Kubo et al. | 564/305 |
| 2006/0134456 A1 | 6/2006 | Ikeda et al. | |
| 2007/0060736 A1 | 3/2007 | Becker et al. | |

FOREIGN PATENT DOCUMENTS

| | | |
|---|---|---|
| EP | 0 676 461 A2 | 10/1995 |
| JP | 6-211757 | 8/1994 |
| JP | 6-346049 | 12/1994 |
| JP | 2001-332384 | 11/2001 |
| JP | 2002063989 A * | 2/2002 |
| JP | 2002134276 A * | 5/2002 |
| JP | 2003-55276 | 2/2003 |
| WO | WO-98/27136 A1 | 6/1998 |
| WO | WO-2004/013073 A1 | 2/2004 |
| WO | WO-2004/016575 A1 | 2/2004 |
| WO | WO-2004/018588 A1 | 3/2004 |
| WO | WO 2004024670 A1 * | 3/2004 |
| WO | WO-2005/014689 A2 | 2/2005 |

OTHER PUBLICATIONS

Machine translation of JP2001-332384. Date of publication: Nov. 20, 2001.*
Machine translation of JP2002-063989. Date of publication: Feb. 28, 2002.*
Machine translation of JP2003-055276. Date of publication: Feb. 26, 2003.*

* cited by examiner

*Primary Examiner* — Lynda Salvatore
*Assistant Examiner* — Andrew K Bohaty
(74) *Attorney, Agent, or Firm* — Connolly Bove Lodge & Hutz LLP

(57) ABSTRACT

The present invention relates to the improvement of organic electroluminescent devices, in particular blue-emitting devices, by using compounds of the formula (1) as host materials in the emitting layer.

17 Claims, No Drawings

PHENANTHRENE DERIVATIVE

RELATED APPLICATIONS

This application is a national stage application (under 35 U.S.C. 371) of PCT/EP2005/010113 filed Sep. 20, 2005, which claims the benefit of European application 04 024 204.2 filed Oct. 11, 2004.

The present invention relates to phenanthrene compounds and to their use in organic electroluminescent devices.

The use of semiconductive organic compounds which are capable of emitting light in the visible spectral region in organic electroluminescent devices (OLEDs) is just starting to be introduced onto the market. The general structure of such devices is described, for example, in U.S. Pat. No. 4,539, 507, U.S. Pat. No. 5,151,629, EP 0676461 and WO 98/27136. Simple devices comprising OLEDs have already been introduced onto the market, as demonstrated by the car radios from Pioneer, the mobile telephones from Pioneer and SNMD, or a digital camera from Kodak with an organic display. Further products of this type will be introduced shortly.

However, these devices still exhibit considerable problems which are in need of urgent improvement:
1. The operative lifetime, especially in the case of blue emission, is still too low, so that it has been possible to date to commercially realize only simple applications.
2. The efficiency has been improved in the last few years, but is still too low, specifically for fluorescent OLEDs, and has to be improved.
3. The operating voltage, specifically for fluorescent OLEDs, is quite high and should therefore be reduced further in order to improve the power efficiency. This is of great significance especially for mobile applications.

Known host materials according to the prior art are anthracene derivatives, for example 2-dinaphthylanthracene (U.S. Pat. No. 5,935,721). Further anthracene derivatives which are suitable as host materials are described, for example, in WO 04/013073 or in WO 04/018588. Host materials based on aryl-substituted pyrenes and chrysenes are described in WO 04/016575. This application in principle also encompasses corresponding anthracene and phenanthrene derivatives, but these are not detailed in the description, so that it is not apparent even to those skilled in the art which of these derivatives might be used profitably for this purpose.

It has been observed that the host material which is used for the emitting dopant plays a crucial role in the properties of the organic electroluminescent device. It should therefore be possible by further optimization of the host material also to further improve the properties of the OLED.

There is thus still a need for improved host materials which, especially together with blue-emitting compounds, lead in organic electroluminescent devices to good efficiencies and simultaneously to high lifetimes. It has now been found that, surprisingly, certain phenanthrene derivatives detailed below, but also dihydrophenanthrene derivatives, dihydropyrene derivatives or tetrahydropyrene derivatives, have distinct improvements over the prior art as a host for blue-emitting dopants or else as an emitter or in other functions. It is possible using these materials to simultaneously obtain high efficiencies and long lifetimes. Moreover, these compounds are synthetically readily obtainable even on a large scale and, in contrast to many phenanthrene derivatives according to the prior art, have good solubility in a large number of organic solvents, so that they are significantly easier to purify than materials according to the prior art. The substitution of the phenanthrene units in the 9- or 9,10-position and the attachment of the aryl substituents in the 2,7-position has surprisingly been found to be particularly suitable in comparison to substitution in other positions of the phenanthrene unit. The parent phenanthrene structure and the numbering of the individual positions is depicted below for the sake of clarity, as are the parent dihydrophenanthrene, dihydropyrene and tetrahydropyrene structures:

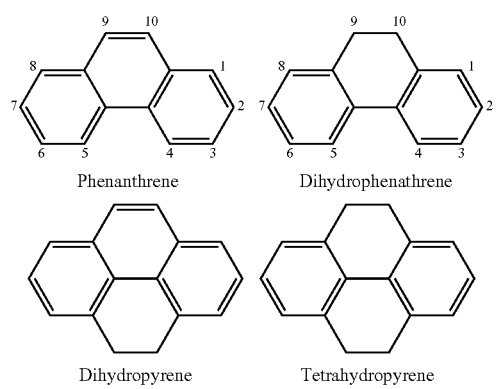

Phenanthrene      Dihydrophenathrene

Dihydropyrene      Tetrahydropyrene

Without wishing to be bound to a particular theory, we still suspect that the substitution in the 9- and/or 10-position leads to a reduced reactivity of these positions, which is reflected in the longer lifetime. It is also observed that the emission of compounds which are aryl-substituted in the 2- and 7-position is deeper blue than that of compounds substituted correspondingly in the 3- and 6-position. These materials are therefore better suited as host materials.

The use of various phenanthrene derivatives in OLEDs has already been described in the literature. For example, WO 04/016575 depicts 3,6-dinaphthylphenanthrene as well as other compounds as a host material for blue OLEDs. However, this compound has the abovementioned weaknesses—lack of substitution in the 9,10-position and light blue emission as a result of substitution in the 3,6-position—so that this compound is not preferable as a host material.

U.S. Pat. No. 5,077,142 describes the use of particular aryl-substituted aromatics, including phenanthrenes, in organic electroluminescent devices. However, it is not evident from the description which of the compounds described in the general and very broad structural formula is suitable for the production of particularly good devices. In particular, there is no indication that it is advisable to substitute the 9- or 9,10-position.

JP 2001/332384 describes aryl-substituted phenanthrenes for use in OLEDs. The compounds detailed here include 3,6,9,10-tetraphenyl-substituted phenanthrenes which, although they are preferred over the above-detailed compounds by virtue of the substitution in the 9,10-position, they still have the disadvantage of 3,6-substitution and the emission which is light blue as a result.

JP 2003/055276 describes phenanthrene derivatives for blue-emitting OLEDs which contain a bicyclic aliphatic radical fused on in the 9,10-position, and which may also be substituted in the 2,7-position. However, these compounds have the disadvantage that the fused bicyclic system has to be synthesized in a complicated manner.

The invention therefore provides compounds of the formula (1)

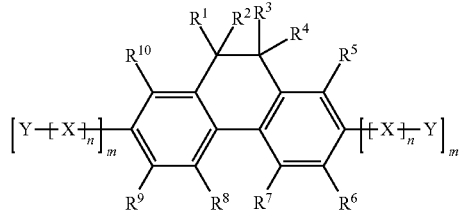

formula (1)

where the symbols and indices are defined as follows:
$R^1$, $R^3$ is the same or different at each instance and is H, F, a straight-chain alkyl or alkoxy chain having 1 to 40 carbon atoms or a branched or cyclic alkyl or alkoxy chain having 3 to 40 carbon atoms, each of which may be substituted by $R^{11}$, and in which one or more non-adjacent carbon atoms may also be replaced by N—$R^{11}$, O, S, CO, O—CO—O, CO—O, —$CR^{11}$=$CR^{11}$—, —C≡C—, Si($R^{11}$)$_2$, SO, SO$_2$ or PO($R^{11}$), and in which one or more hydrogen atoms may also be replaced by F, Cl, Br, I or CN, or an aromatic or heteroaromatic ring system which has 5 to 60 aromatic ring atoms and may also be substituted by one or more $R^{11}$ radicals;
with the proviso that at least one of the two $R^1$ and $R^3$ radicals is not H;
$R^2$, $R^4$ is the same or different at each instance and is $R^1$, or $R^2$ and $R^4$ are not substituents but instead together form a π bond, so as to result in a phenanthrene system instead of the dihydrophenanthrene system;
$R^5$, $R^6$, $R^7$, $R^8$, $R^9$, $R^{10}$ is the same or different at each instance and is H, F, Cl, Br, I, CN, NO$_2$, B(O$R^{11}$)$_2$, a straight-chain alkyl or alkoxy chain having 1 to 40 carbon atoms or a branched or cyclic alkyl or alkoxy chain having 3 to 40 carbon atoms, each of which may be substituted by $R^{11}$, and in which one or more non-adjacent carbon atoms may also be replaced by N—$R^{11}$, O, S, CO, O—CO—O, CO—O, Si($R^{11}$)$_2$, SO, SO$_2$, PO($R^{11}$), —$CR^{11}$=$CR^{11}$— or —C≡C—, and in which one or more hydrogen atoms may also be replaced by F, Cl, Br, I or CN, or an aromatic or heteroaromatic ring system which has 5 to 60 aromatic ring atoms and may also be substituted by one or more $R^{11}$ radicals; in this structure, two or more $R^5$ to $R^{10}$ radicals together may also form a further mono- or polycyclic, aliphatic ring system;
X is the same or different at each instance and is —$CR^{11}$=$CR^{11}$—, —C≡C—, —(NY)—, C(=O), P(=O)(Y), S(=O) or S(=O)$_2$;
Y is the same or different at each instance and is an aromatic or heteroaromatic ring system which has 5 to 60 aromatic ring atoms and may be substituted by one or more $R^{11}$ radicals or unsubstituted; in this structure, two or more Y radicals together may form a ring system;
$R^{11}$ is the same or different at each instance and is H, a straight-chain alkyl or alkoxy chain having 1 to 22 carbon atoms or a branched or cyclic alkyl or alkoxy chain having 3 to 22 carbon atoms, in which one or more non-adjacent carbon atoms may also be replaced by O, S, SO, SO$_2$, O—CO—O, CO—O, —CH=CH—, —C≡C—, and in which one or more hydrogen atoms may also be replaced by F, Cl, Br, I or CN, or an aryl, heteroaryl, aryloxy or heteroaryloxy group which has 5 to 40 carbon atoms and may also be substituted by one or more non-aromatic $R^{11}$ radicals; in this structure, two or more of the $R^{11}$ radicals, together and/or with $R^1$ to $R^{10}$, may also form a ring system;
n is the same or different at each instance and is 0 or 1;
m is the same or different at each instance and is 0, 1, 2, 3 or 4, with the proviso that at least one index m is not equal to 0, and with the further proviso that neither index m is equal to 0 if both n indices=0;
with the proviso that at least two of the substituents $R^1$ to $R^4$ are not H when the compound of the formula (1) is a tetrahydropyrene system, and with the proviso that the following compound is excluded from the invention:

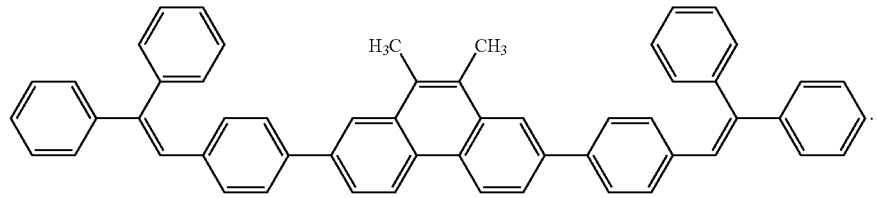

An aromatic ring system in the context of this invention contains 6 to 40 carbon atoms. A heteroaromatic ring system in the context of this invention contains 2 to 40 carbon atoms and at least one heteroatom, preferably selected from N, O and/or S, the sum of the carbon atoms and heteroatoms being at least 5. In the context of this invention, an aromatic or heteroaromatic ring system shall refer to a system which does not necessarily contain only aromatic or heteroaromatic groups, but in which a plurality of aromatic or heteroaromatic groups may also be interrupted by a short, non-aromatic unit (fewer than 10% of the atoms other than H, preferably fewer than 5% of the atoms other than H), for example an sp$^3$-hybridized carbon atom. For example, systems such as 9,9'-spirobifluorene, 9,9-diarylfluorene, etc., should also be understood to be aromatic ring systems in the context of this application. This term likewise also includes simple or fused aromatics, for example phenyl, naphthyl, anthryl, etc., or aromatics joined to one another, for example biphenyl, binaphthyl, etc. However, the term aromatic ring system is not intended to include any triarylamine group.

In the context of the present invention, a cyclic alkyl group shall be understood to mean a monocyclic, bicyclic or polycyclic alkyl group. In the context of the present invention, a $C_1$- to $C_{40}$-alkyl group in which individual hydrogen atoms or CH$_2$ groups may also be replaced by the abovementioned groups are more preferably the methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyt, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl radicals. A $C_1$- to $C_{40}$-alkoxy group is more preferably methoxy, ethoxy, n-propoxy, i-propoxy, n-butoxy, i-butoxy, s-butoxy, t-butoxy or 2-methylbutoxy. An aromatic or heteroaromatic ring system having 5-40 aromatic ring atoms, which may also in each case be substituted by the abovementioned R radicals and which may be attached via any positions to the aromatic or heteroaromatic, is in particular groups which are derived from benzene, naphthalene, anthracene, phenanthrene, pyrene, chrysene, perylene, fluoranthene, naphthacene, pentacene, benzpyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalineimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzpyrimidine, quintoxaline, 1,5-diazaanthracene 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Even if this is apparent from the above description, it is mentioned here explicitly once again that two or more $R^5$ to $R^{10}$ radicals in formula (1) may also together form a further aliphatic ring system. This is especially true of the substituents $R^7$ and $R^8$ which can form a further 6-membered ring system, leading to the formation of a dihydropyrene system or tetrahydropyrene system.

In a preferred embodiment of the invention, $R^1$ and $R^3$ are the same or different at each instance and are H, F, a straight-chain alkyl chain having 1 to 10 carbon atoms or a branched or cyclic alkyl chain which has 3 to 10 carbon atoms, each of which may be substituted by $R^{11}$, and in which one or more hydrogen atoms may also be replaced by F, Cl, Br, I or CN, or an aromatic or heteroaromatic ring system which has 5 to 40 aromatic ring atoms and may also be substituted by one or more $R^{11}$ radicals, with the proviso that at least one of the two radicals $R^1$ and $R^3$ is not H. More preferably, $R^1$ and $R^3$ are the same or different at each instance and are F, a straight alkyl chain having 1 to 4 carbon atoms or a branched alkyl chain having 3 or 4 carbon atoms, in which one or more hydrogen atoms may also be replaced by F or CN, or an aromatic or heteroaromatic ring system which has 6 to 25 aromatic ring atoms and may also be substituted by one or more $R^{11}$ radicals.

In a further preferred embodiment of the invention, $R^2$ and $R^4$ are the same or different at each instance and are the preferred $R^1$; or $R^2$ and $R^4$ are not substituents, but instead together form a $\pi$ bond, so as to result in a phenanthrene system instead of the dihydrophenanthrene system; more preferably, $R^2$ and $R^4$ together form a $\pi$ bond, so as to result in a phenanthrene system.

Furthermore, $R^5$, $R^6$, $R^7$, $R^8$, $R^9$ and $R^{10}$ are preferably the same or different at each instance and are H, F, a straight alkyl chain having 1 to 40 carbon atoms, preferably having 1 to 10 carbon atoms, or a branched or cyclic alkyl chain having 3 to 40 carbon atoms, preferably having 3 to 10 carbon atoms, each of which may be substituted by $R^{11}$, and in which one or more hydrogen atoms may also be replaced by F, or an aromatic or heteroaromatic ring system which has 5 to 40 aromatic ring atoms and may also be substituted by one or more $R^{11}$ radicals; in this structure, two or more $R^5$ to $R^{10}$ radicals together may also form a further mono- or polycyclic, aliphatic ring system. More preferably, $R^5$, $R^6$, $R^7$, $R^8$, $R^9$ and $R^{10}$ are the same or different at each instance and are H or F, or the $R^7$ and $R^8$ positions are bridged by a $C(R^{11})_2$—$C(R^{11})_2$ chain.

Furthermore, X is preferably the same or different at each instance and is —$CR^{11}$=$CR^{11}$—, —C≡C—, C(=O), P(=O)(Y) or —(NY)—; more preferably, X is the same or different at each instance and is —CH=CH—, C(=O), P(=O)(Y) or —(NY)—.

Furthermore, Y is preferably the same or different at each instance and is an aromatic or heteroaromatic ring system which has 6 to 30 carbon atoms and may be substituted by one or more $R^{11}$ radicals or unsubstituted; more preferably, Y is the same or different at each instance and is an aromatic or heteroaromatic ring system which has 10 to 25 carbon atoms and may be substituted or unsubstituted by one or more $R^{11}$ radicals.

Furthermore, the index m is preferably the same or different at each instance and is 1, 2 or 3, more preferably 1 or 2, most preferably 1.

More preferably, at least one of the substituents Y contains at least one fused polycyclic aromatic ring system, in particular naphthalene, anthracene, phenanthrene, pyrene, dihydropyrene, chrysene, naphthacene, pentacene or perylene, most preferably naphthalene, anthracene, phenanthrene or pyrene, or at least one aza heterocycle, in particular pyridine, pyrazine, pyrimidine, pyridazine, quinoline, isoquinoline, quinoxaline or phenanthroline.

Furthermore, preference is given to compounds of the formula (1) in which the two substituents $R^1$ and $R^3$ are the same. Preference is equally given to compounds of the formula (1) in which the two substituents $R^2$ and $R^4$ are the same or together form a $\pi$ bond. Preference is equally given to compounds of the formula (1) in which the two substituents [Y—[X]$_n$]$_m$— are selected identically. Particular preference is given to compounds which have a symmetrical structure, in which the two substituents $R^1$ and $R^3$ are thus selected identically and in which the two substituents $R^2$ and $R^4$ are selected identically or together form a bond and in which the two substituents [Y—[X]$_n$]$_m$— are selected identically.

Depending on the use of the compounds of the formula (1), the following preferences also apply:

When the compounds of the formula (1) are used as a host material, n is preferably 0.

When the compounds of the formula (1) are used as emitting compounds (dopants), it is preferred that at least one index n=1, where the corresponding m is then 1, 2, 3 or 4, and that at least one X is —$CR^{11}$=$CR^{11}$— or —C≡C—; more preferably, both n=1 and both m=1, 2, 3 or 4 and X is defined as described above.

When the compounds of the formula (1) are used as a hole transport compound, it is preferred that at least one n=1, where the corresponding m is then 1, 2, 3 or 4, and that at least one X=N—Y; more preferably, both n=1 and both m=1, 2, 3 or 4, and X is defined as described above.

When the compounds of the formula (1) are used as a triplet matrix material, it is preferred that at least one n=1, where the corresponding m is then 1, 2, 3 or 4, and that at least one X=C(=O), SO, SO$_2$ or P(=O)(Y); more preferably, both n=1 and both m=1, 2, 3 or 4, and X is defined as described above.

Depending on the way in which the compounds of the formula (1) are processed, different values are preferred for the index m. When the compound is applied in vacuum deposition processes, the index m is preferably 1 or 2. When the compound is applied preferentially from solution and/or by printing processes, the index m may also preferably be 3 or 4.

The inventive compounds can be prepared from the corresponding known 2,7-dibromophenanthrene derivatives or the corresponding dihydrophenanthrene, dihydropyrene or tetrahydropyrene derivatives by metal-catalysed coupling reactions, in particular Suzuki coupling, Hartwig-Buchwald coupling and Heck coupling. The synthesis of the dihydrophenanthrene precursors or of the phenanthrene precursors is described in WO 05/014689 and in the patent application DE 102004020298.2 which had not been published at the priority date of the present application.

Examples of preferred compounds of the formula (1) are the structures (1) to (24) depicted below

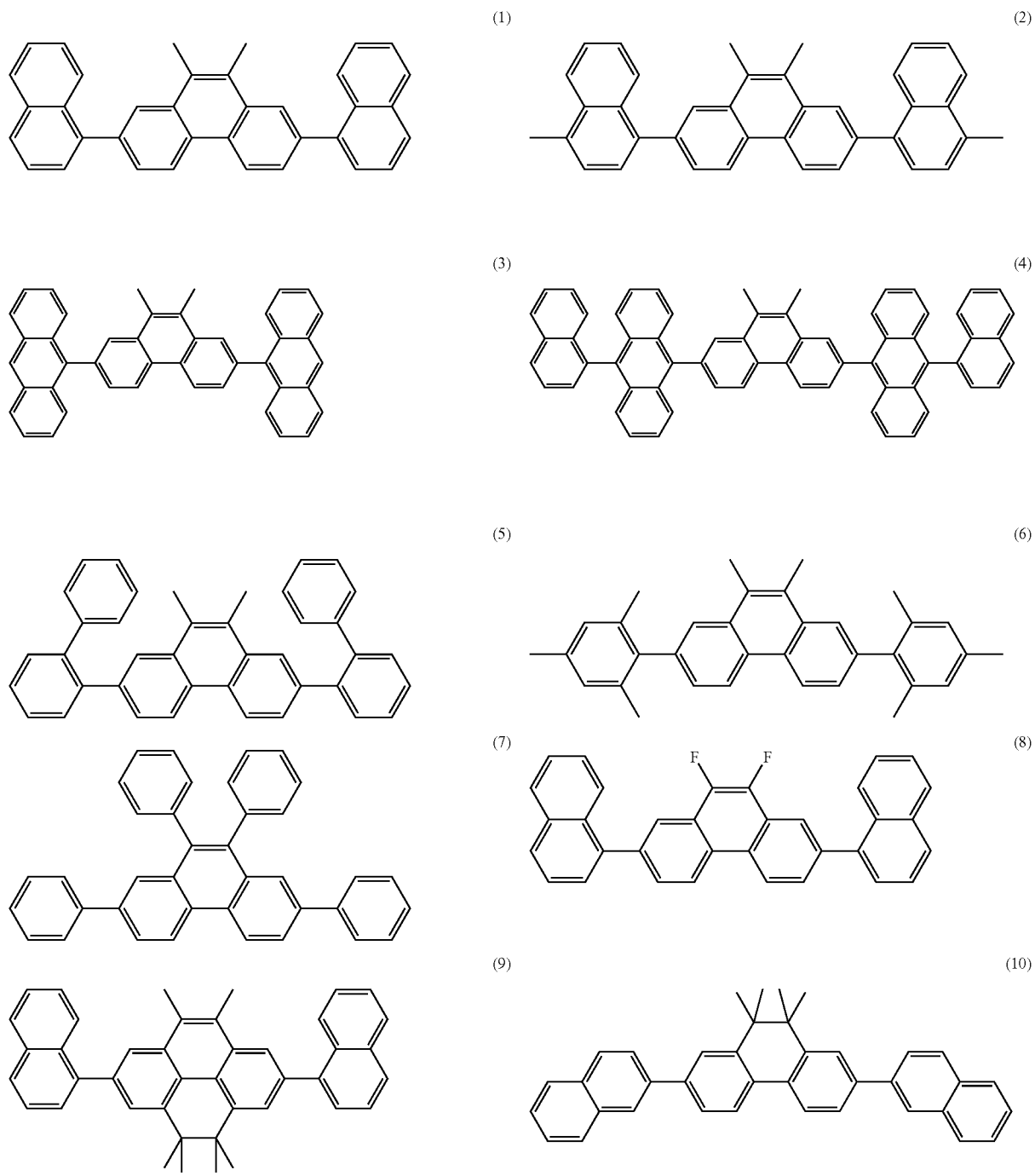

-continued
(11)
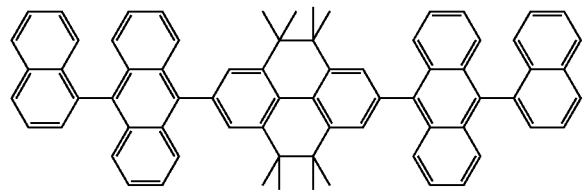
(12)
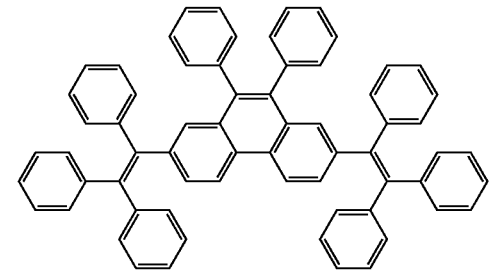
(13)
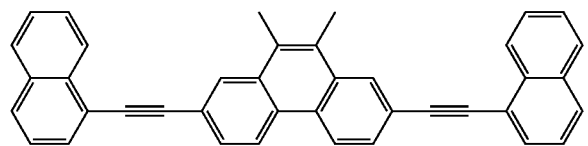
(14)
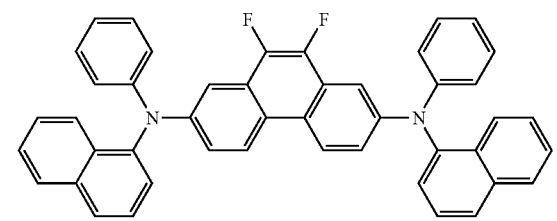
(15)
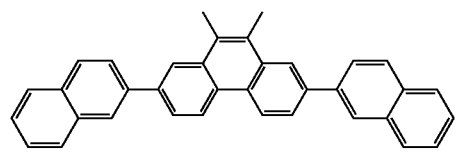
(16)
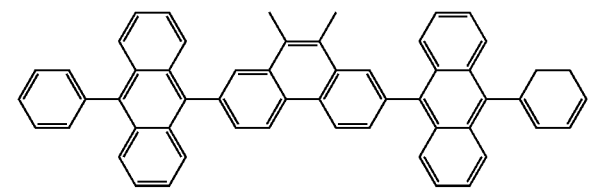
(17)
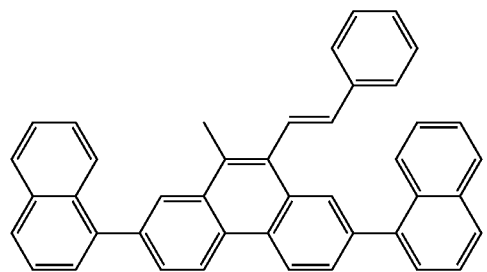
(18)
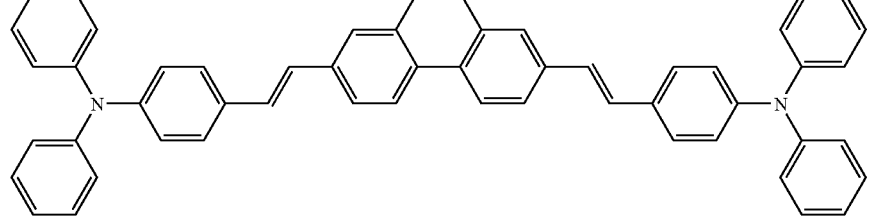
(19)
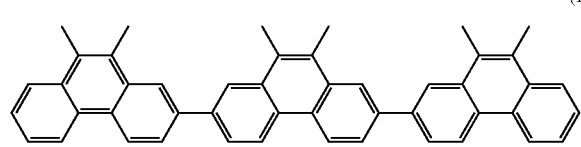
(20)
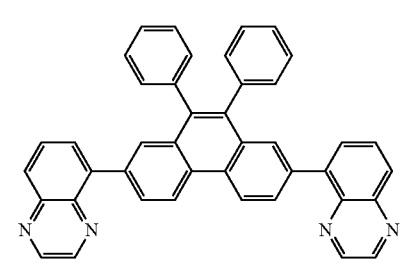

-continued

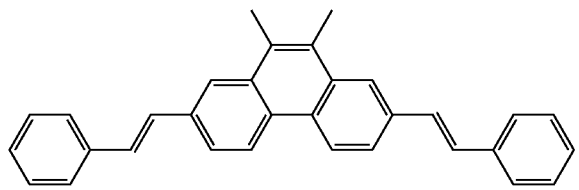
(21)

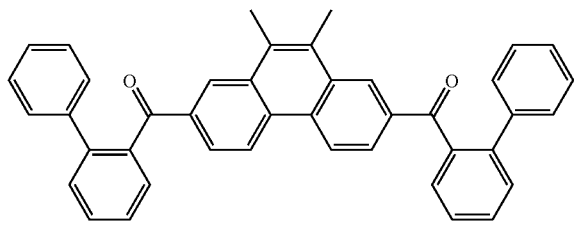
(22)

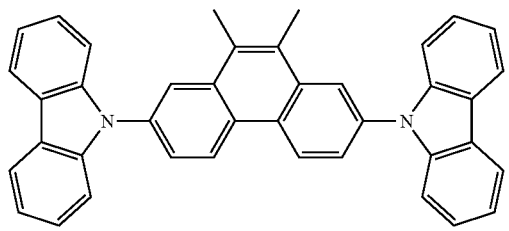
(23)

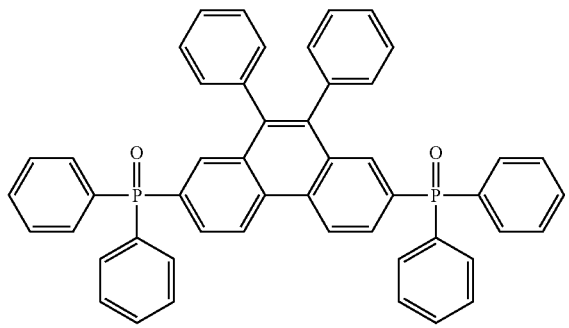
(24)

The compounds of the formula (1) are particularly suitable for use in organic electroluminescent devices. In this case, the compound is preferably used in the emitting layer, either as a host material together with a fluorescent or phosphorescent dopant or, especially in the case of suitable substitution, as a dopant together with a host material. Preference is likewise given to using the compound as a hole transport material in a hole transport layer, especially when at least one of the substituents is a diarylamine group. Preference is likewise given to using the compound as an electron transport material in an electron transport layer, especially when at least one of the substituents contains a fused and/or electron-deficient aromatic or a carbonyl function, an SO, an $SO_2$ or a phosphine oxide group. Furthermore, the inventive compound is preferably used as a hole blocking material in a hole blocking layer, in particular in phosphorescent electroluminescent devices.

The present invention therefore further provides mixtures of a compound of the formula (1) with a dopant, or of a compound of the formula (1) with a host material in which case the dopant makes the predominant contribution to the emission. The dopant with which the compound of the formula (1) is mixed, or the host material with which the compound of the formula (1) is mixed, may also be polymeric.

The present invention further provides for the use of compounds of the formula (1) in organic electronic devices, especially in organic electroluminescent devices, preferably as a host material or as an emitting material (dopant).

The invention thus likewise provides organic electronic devices, especially organic electroluminescent devices, having one or more active layers, at least one of these active layers containing one or more compounds of the formula (1). The active layer may, for example, be a light-emitting layer and/or a charge transport layer and/or a charge injection layer, but preferably a light-emitting layer.

When the compounds of the formula (1) are used as a host material, preferred dopants are organic or organometallic compounds whose emission is at a longer wavelength than that of the compound of the formula (1). The dopants selected may emit light from the singlet or from the triplet state.

Particularly preferred dopants which emit light from the singlet state are compounds which simultaneously have one or more optionally substituted stilbene units and one or more triarylamine units. Particularly preferred dopants which emit light from the triplet state are ortho-metallated iridium complexes and platinum complexes.

The fraction of the compound of the formula (1) in the mixture is between 1 and 99.9% by weight, preferably between 50 and 99.5% by weight, more preferably between 80 and 99% by weight, in particular between 90 and 99% by weight, when the compound of the formula (1) is used as a host material.

The fraction of the compound of the formula (1) in the mixture is between 0.1 and 99% by weight, preferably between 0.5 and 50% by weight, more preferably between 1 and 20% by weight, in particular between 1 and 10% by weight, when the compound of the formula (1) is used as a dopant.

Apart from the emitting layer, the organic electroluminescent device also comprises anode and cathode and may also comprise further layers. These may, for example, be: hole injection layer, hole transport layer, hole blocking layer, electron transport layer and/or electron injection layer. However, it should be pointed out here that not necessarily each of these layers need be present.

For instance, especially in the case of use of compounds of the formula (1) as a host for fluorescent or phosphorescent dopants, very good results are still obtained when the organic electroluminescent device does not contain any separate hole blocking and/or electron transport layer and the emitting layer directly adjoins the electron injection layer or the cathode. It may likewise be preferred when the organic electroluminescent device does not contain any separate hole transport layer and the emitting layer directly adjoins the hole injection layer or the anode, especially when the compound of the formula (1) is substituted by at least one diarylamino group. It may also be preferred when compounds of the formula (1) are used in more than one layer. The compounds used in the different layers may be the same or different compounds of the formula (1). For example, these compounds may be used not only in the emitting layer, but also additionally in the hole blocking layer or in the electron transport layer or, in the event of appropriate suitable substitution, also in the hole transport layer.

Preference is further given to an organic electroluminescent device characterized in that one or more layers are applied with a sublimation process at a pressure of less than $10^{-5}$ mbar, preferably less than $10^{-6}$ mbar, more preferably less than $10^{-7}$ mbar, or with the OVPD (Organic Vapour Phase Deposition) process or with the aid of carrier gas sublimation at a pressure between $10^{-5}$ mbar and 1 bar or from solution, for example by spincoating, or with any printing process, for example screen printing, flexographic printing, offset printing, LITI (Light-Induced Thermal Imaging, thermal transfer printing) or inkjet printing.

The above-described emitting compounds have the following surprising advantages over the prior art:

1. The emission of compounds of the formula (1) is deeper blue than that of phenanthrene derivatives according to the prior art, which are substituted in the 3,6-positions instead of in the 2,7-positions. These compounds are therefore better suited as host materials for blue emission.
2. The efficiency of corresponding devices is higher in comparison to systems according to the prior art.
3. The stability of corresponding devices is higher in comparison to systems according to the prior art, which is exhibited in particular in a higher lifetime.
4. The operating voltage is reduced. This increases the power efficiency. This is especially true when a compound of the formula (1) is used as a host material with a stilbenamine as a fluorescent dopant or with an iridium complex as a phosphorescent dopant.
5. The compounds of the formula (1) are readily obtainable synthetically and can be prepared without problems even on a large scale.
6. The compounds have better solubility than phenanthrene derivatives which are used according to the prior art in organic electronic devices and which do not have any substitution in the 9,10-positions. This allows them to be purified more easily, which constitutes a considerable technical advantage.

In the present application text and also in the examples which follow, the aim is the use of inventive compounds in relation to OLEDs and the corresponding displays. In spite of this restriction of the description, it is possible for those skilled in the art without any further inventive activity also to utilize the inventive compounds for other uses in other electronic devices, for example for organic field-effect transistors (O-FETs), organic thin-film transistors (O-TFTs), organic integrated circuits (O-ICs), organic solar cells (O-SCs), organic field-quench devices (O-FQDs), organic light-emitting transistors (O-LETs), light-emitting electrochemical cells (LECs) or else organic laser diodes (O-laser), to mention just a few applications.

The use of the inventive compounds in the corresponding devices, just like these devices themselves, likewise form part of the subject-matter of the present invention. The invention is illustrated in detail by the examples which follow without any intention to restrict it thereto.

EXAMPLES

The syntheses which follow were, unless stated otherwise, carried out under a protective gas atmosphere. The reactants were purchased from ALDRICH or ABCR (4-methylnaphthalene-1-boronic acid, 1-naphthylphenylamine, palladium (II) acetate, tri-o-tolylphosphine, inorganics, solvents). The synthesis of 2,7-dibromo-9,10-dimethylphenanthrene is described in the patent application DE 102004020298.2 which had not been published at the priority date of the present application, and that of 9-(4-methylnaphthyl)-10-bromoanthracene in EP 05009643.7.

Example 1

Synthesis of the Phenanthrene Derivative P1

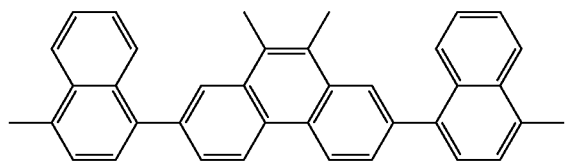

A degassed, efficiently stirred suspension of 37.2 g (200 mmol) of 4-methylnaphthalene-1-boronic acid, 18.0 g (50 mmol) of 2,7-dibromo-9,10-dimethylphenanthrene and 52.2 g (210 mmol) of potassium phosphate 1-hydrate in a mixture of 75 ml of dioxane, 150 ml of toluene and 200 ml of water was admixed with 457 mg (1.5 mmol) of tri-o-tolylphosphine and then with 56 mg (0.25 mmol) of palladium(II) acetate. After heating under reflux for 16 h and cooling the reaction mixture, the precipitated solid was filtered off with suction and washed three times with 100 ml each time of water and three times with 100 ml each time of ethanol. After drying under reduced pressure (1 mbar, 80° C., 16 h), the product was extracted in a Soxhlett extractor with chloroform through a glass fibre extraction sleeve (pore size 0.5 μm) in order to remove palladium traces. The product which remained after concentration of the chloroform was recrystallized three times from chlorobenzene (approx. 25 ml/g) and three times from DMF (approx. 60 ml/g), and subsequently sublimed twice under high vacuum (p=5×$10^{-5}$ mbar, T=320-330° C.). The yield at a purity of 99.9% by HPLC was 15.6 g (32 mmol), corresponding to 64.2% of theory.

$^1$H NMR (TCE-d2): δ [ppm]=8.87 (d, $^3J_{HH}$=8.6 Hz, 2H, H4-phen), 8.27 (d, $^4J_{HH}$=1.5 Hz, 2H, H1-phen), 8.13 (d, $^3J_{HH}$=8.5 Hz, 2H, H-naphth), 8.04 (d, $^3J_{HH}$=8.5 Hz, 2H, H-naphth), 7.81 (dd, $^3J_{HH}$=8.6 Hz, $^4J_{HH}$=1.5 Hz, 2H, H3-phen), 7.60 (m, 2H), 7.54-7.47 (m, 6H), 2.80 (s, CH$_3$, OH), 2.76 (s, CH$_3$, 6H).

Example 2

Solubility Comparison

The phenanthrene derivative P1 containing methyl groups in the 9- and 10-position on the phenanthrene features moderate to good solubility in common organic solvents, as a result of which it can be purified easily by recrystallization (see Example 1).

In contrast, phenanthrenes which are structurally analogous but unsubstituted in the 9- and 10-position have distinctly poorer solubility in organic solvents. This leads to considerable problems in the purification, since substantially larger apparatus and distinctly larger amounts of solvent are required for this purpose.

Example 3

Emission from 3,6- and from 2,7-Substituted Phenanthrenes

The electronic properties of some 3,6- and 2,7-substituted phenanthrenes were determined by quantum chemistry calculation. The geometry was optimized semi-empirically in the ground state. The HOMO and LUMO values were determined by DFT (density functional theory) calculation (B3PW91/6-31g(d)). All calculations were carried out with the Gaussian 98 software package.

Table 1 compares the calculated HOMO and LUMO positions, and also the band gap for 3,6- and 2,7-dinaphthyl-substituted phenanthrenes. As can be seen from these numerical values, the band gap for 2,7-dinaphthyl-substituted phenanthrenes is more than 0.1 eV greater than for the corresponding 3,6-substituted compounds, which shows that the inventive compounds are better suited as host materials for blue-emitting dopants than compounds according to the prior art.

TABLE 1

Comparison between 2,7- and 3,6-disubstituted phenanthrenes

| Compound | HOMO [eV] | LUMO [eV] | Band gap [eV] |
|---|---|---|---|
| 2,7-Bis(1-naphthyl)phenanthrene | −5.90 | −2.43 | 3.47 |
| 3,6-Bis(1-naphthyl)phenanthrene | −5.78 | −2.43 | 3.35 |
| 2,7-Bis(4-methyl-1-naphthyl)phenanthrene | −5.80 | −2.39 | 3.41 |
| 3,6-Bis(4-methyl-1-naphthyl)phenanthrene | −5.69 | −2.39 | 3.30 |

Example 4

2,7-Bis[9-(4-methylnaphthyl)-10-anthracenyl]-9,10-dimethylphenanthrene a) 9,10-Dimethylphenanthrene-2,7-bisboronic acid glycol ester

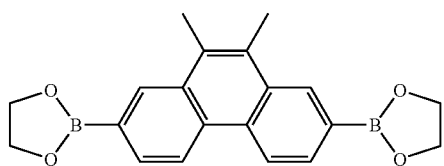

An efficiently stirred suspension, cooled to −78° C., of 73.9 g (203 mmol) of 2,7-dibromo-9,10-dimethylphenanthrene in 3000 ml of THF was admixed over 30 min. with 640 ml (960 mmol) of tert-butyllithium, 1.5 molar in hexane, and subsequently stirred at 78° C. for 5 h. The thus obtained suspension was transferred rapidly through a hose to an efficiently stirred mixture, cooled to −78° C., of 54.0 ml of trimethyl borate and 500 ml of THF. After slowly warming to room temperature, the reaction mixture was admixed with a mixture of 30 ml of acetic acid and 300 ml of water, and stirred for 1 h. The aqueous phase was removed; the organic phase was concentrated to dryness. The residue was admixed with 1000 ml of toluene and 23.4 ml of ethylene glycol and heated on a water separator for 2 h. After the water separation had ended 700 ml of toluene were distilled off and the residue was admixed with 300 ml of n-heptane. The precipitated crude product was filtered off with suction and recrystallized twice from toluene (2 g/ml). The yield at a purity of 99% by $^1$H NMR was 46.7 g (135 mmol), corresponding to 66.5% of theory.

$^1$H NMR (CDCl$_3$): δ [ppm]=8.73 (d, 2H), 8.63 (s, 2H), 8.00 (d, 2H), 4.46 (s, 8H, CH$_2$), 2.78 (s, 6H, CH$_3$).

b) 2,7-Bis(9-(4-methylnaphthyl)-10-anthracenyl)-9,10-dimethyl phenanthrene

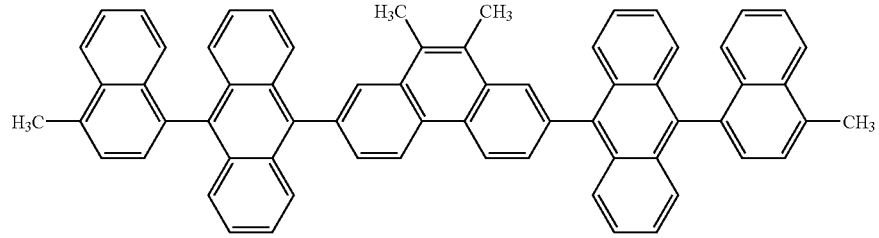

An efficiently stirred, degassed suspension of 40.1 g (116 mmol) of 9,10-dimethylphenanthrene-2,7-bisboronic acid glycol ester, 101.0 g (255 mmol) of 9-(4-methylnaphthyl)-10-bromoanthracene and 108.3 g (510 mmol) of potassium phosphate in a mixture of 300 ml of dioxane, 600 ml of toluene and 1000 ml of water was admixed with 2.12 g (7.0 mmol) of tri-o-tolylphosphine and then with 260 mg (1.2 mmol) of Pd(OAc)$_2$, and then heated under reflux for 48 h. After cooling, the pale yellow precipitate was filtered off with suction, washed three times with 300 ml of toluene, three times with 300 ml of a mixture of ethanol/water (1:1, v/v) and three times with 300 ml of ethanol, and subsequently dried under reduced pressure. The crude product was recrystallized five times from NMP (70 ml 1 g) and five times from dichlorobenzene (55 ml/g), and finally stirred under reflux twice in 3 l of ethanol and sublimed twice under high vacuum (p=1× 10$^{-5}$ mbar, T=460-470° C.). The yield at a purity of 99.8% by HPLC was 66.3 g (79 mmol), corresponding to 68.1% of theory.

$^1$H NMR (TCE-d2): δ [ppm]=9.14 (m, 2H), 8.42 (d, 2H), 8.21 (d, 2H), 7.93 (dd, 2H), 7.87 (dd, 4H), 7.62-7.53 (m, 10H), 7.37 (d, 2H), 7.35 (d, 2H), 7.29-7.25 (m, 8H), 2.92 (s, 6H), 2.82 (dd, 6H).

Example 5

2,7-Bis(N-phenyl-N-1-naphthylamino)-9,10-dimethylphenanthrene

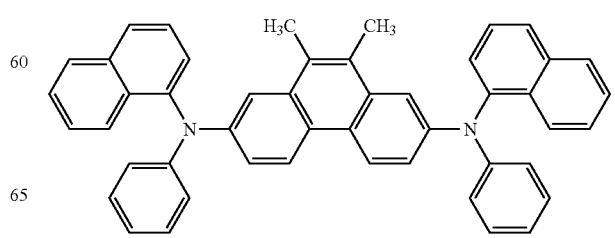

An efficiently stirred suspension of 60.4 g (166 mmol) of 2,7-dibromo-9,10-dimethylphenanthrene and 80.3 g (366 mmol) of 1-naphthylphenylamine in 1500 ml of toluene was admixed successively with 1.25 ml (6.6 mmol) of di-tert-butyl-chlorophosphine, 741 mg (3.3 mmol) of palladium(II) acetate and then 38.7 g (403 mmol) of sodium tert-butoxide, and heated under reflux for 2 h. After cooling to 50° C., the mixture was admixed with 1000 ml of water, and the organic phase was removed, filtered through silica gel and then concentrated to dryness. The solid was stirred at high temperature once with 1000 ml of ethanol, three times with 500 ml of ethyl acetate and three times with acetone. Subsequently, the solid was recrystallized three times from DMSO (1.5 ml/g) with addition of ethanol (0.1 ml/g) after cooling of the solution to 80° C. Finally, the product was stirred under reflux twice with 500 ml of ethanol and sublimed twice under high vacuum (p=5×10$^{-5}$ mbar, T=330° C.). The yield at a purity of 99.9% by HPLC was 57.5 g (90 mmol), corresponding to 54.0% of theory.

$^1$H NMR (CDCl3-0.01µ hydrazine hydrate): δ [ppm]=8.32 (d, 2H), 7.98, (d, 2H), 7.89 (d, 2H), 7.79 (d, 2H), 7.69 (s, 2H), 7.49 (t, 2H), 7.44 (dd, 2H), 7.39 (d, 2H), 7.32 (d, 2H), 7.24 (dd, 2H), 7.20 (dd, 4H), 7.08 (d, 4H), 6.95 (dd, 2H), 2.34, (s, 6H).

The invention claimed is:

1. A compound of the formula (1)

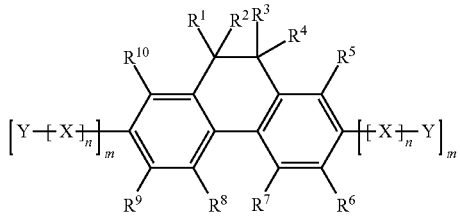

formula (1)

wherein the symbols and indices are defined as follows:

$R^1$ and $R^3$
is the same or different at each instance and is H, F, a straight-chain alkyl chain having 1 to 10 carbon atoms or a branched alkyl chain which has 3 to 10 carbon atoms and is optionally substituted by $R^{11}$, and in which one or more hydrogen atoms in the straight chain or branched alkyl chain is optionally replaced by F, Cl, Br, I or CN, or heteroaromatic ring system which has 5 to 40 aromatic ring atoms and is optionally substituted by one or more $R^{11}$ radicals; with the proviso that at least one of the two radicals $R^1$ and $R^3$ is not H;

$R^2$ and $R^4$
is the same or different at each instance and is $R^1$, or $R^2$ and $R^4$ are not substituents but instead together form a bond, so as to result in a phenanthrene system instead of the dihydrophenanthrene system;

$R^5$, $R^6$, $R^7$, $R^8$, $R^9$ and $R^{10}$
is the same or different at each instance and is H, F, Cl, Br, I, CN, NO$_2$, B(OR$^{11}$)$_2$, a straight-chain alkyl or alkoxy chain having 1 to 40 carbon atoms or a branched or cyclic alkyl or alkoxy chain having 3 to 40 carbon atoms, each of which is optionally substituted by $R^{11}$, and in which one or more non-adjacent carbon atoms optionally is replaced by N—R$^{11}$, S, CO, O—CO—O, CO—O, SO, SO$_2$, POR$^{11}$, —CR$^{11}$=CR$^{11}$— or —C≡C— and in which one or more hydrogen atoms is optionally replaced by F, Cl, Br, I or CN, or an aromatic or heteroaromatic ring system which has 5 to 60 aromatic ring atoms and is optionally substituted by one or more $R^{11}$ radicals; in this structure, two or more $R^5$ to $R^{10}$ radicals together optionally form a further mono- or polycyclic ring system;

X is the same or different at each instance and is —CR$^{11}$=CR$^{11}$—, —C≡C—, C(=O), S(=O), S(=O)$_2$, P(=O)(Y) or —(NY)—;

Y is the same or different at each instance and is an aromatic or heteroaromatic ring system which has 5 to 60 aromatic ring atoms and is optionally substituted by one or more $R^{11}$ radicals or unsubstituted; in this structure, two or more Y groups together optionally form a ring system;

$R^{11}$ is the same or different at each instance and is H, a straight-chain alkyl or alkoxy chain having 1 to 22 carbon atoms or a branched or cyclic alkyl or alkoxy chain having 3 to 22 carbon atoms, in which one or more non-adjacent carbon atoms in each case is optionally replaced by O, S, SO, SO$_2$, CO, O—CO—O, CO—O, —CH=CH—, —C≡C—, and in which one or more hydrogen atoms is optionally replaced by F, Cl, Br, I or CN, or an aryl, heteroaryl, aryloxy or heteroaryloxy group which has 5 to 40 carbon atoms and is optionally be substituted by one or more non-aromatic $R^{11}$ radicals; in this structure;

n is the same or different at each instance and is 0 or 1;

m is the same or different at each instance and is 0, 1, 2, 3 or 4, with the proviso that at least one index m is not equal to 0, and with the further proviso that neither index m is equal to 0 if both n=0;

with the proviso that at least two of the substituents $R^1$ to $R^4$ are not H when the compound of the formula (1) is a tetrahydropyrene system, and with the proviso that the following compound is excluded from the invention:

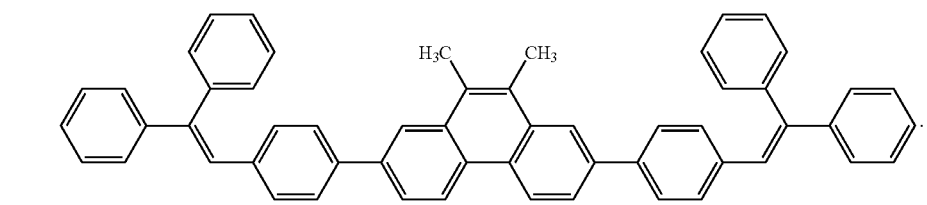

2. A compound of the formula (1)

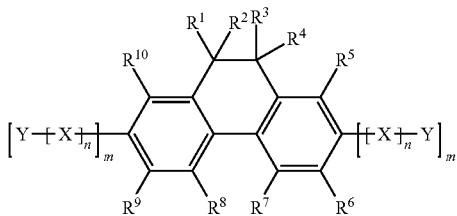

formula (1)

wherein the symbols and indices are defined as follows:

$R^1$ and $R^3$
  is the same or different at each instance and is H, F, a straight-chain alkyl chain having 1 to 10 carbon atoms or a branched or cyclic alkyl chain which has 3 to 10 carbon atoms and is optionally substituted by $R^{11}$, and in which one or more hydrogen atoms in the straight chain, branched or cyclic alkyl chain is optionally replaced by F, Cl, Br, I or CN, with the proviso that at least one of the two radicals $R^1$ and $R^3$ is not H;

$R^2$ and $R^4$
  together form a bond, so as to result in a phenanthrene system instead of the dihydrophenanthrene system;

$R^5$, $R^6$, $R^7$, $R^8$, $R^9$ and $R^{10}$
  is the same or different at each instance and is H, F, Cl, Br, I, CN, $NO_2$, $B(OR^{11})_2$, a straight-chain alkyl or alkoxy chain having 1 to 40 carbon atoms or a branched or cyclic alkyl or alkoxy chain having 3 to 40 carbon atoms, each of which is optionally substituted by $R^{11}$, and in which one or more non-adjacent carbon atoms optionally is replaced by N—$R^{11}$, O, S, CO, O—CO—O, CO—O, SO, $SO_2$, $POR^{11}$, —$CR^{11}$=$CR^{11}$— or —C≡C—, and in which one or more hydrogen atoms is optionally replaced by F, Cl, Br, I or CN, or an aromatic or heteroaromatic ring system which has 5 to 60 aromatic ring atoms and is optionally substituted by one or more $R^{11}$ radicals; in this structure, two or more $R^5$ to $R^{10}$ radicals together optionally form a further mono- or polycyclic ring system;

X is the same or different at each instance and is —$CR^{11}$=$CR^{11}$—, —C≡C—, C(=O), S(=O), $S(=O)_2$, P(=O)(Y) or —(NY)—;

Y is the same or different at each instance and is an aromatic or heteroaromatic ring system which has 5 to 60 aromatic ring atoms and is optionally substituted by one or more $R^{11}$ radicals or unsubstituted; in this structure, two or more Y groups together optionally form a ring system;

$R^{11}$ is the same or different at each instance and is H, a straight-chain alkyl or alkoxy chain having 1 to 22 carbon atoms or a branched or cyclic alkyl or alkoxy chain having 3 to 22 carbon atoms, in which one or more non-adjacent carbon atoms in each case is optionally replaced by O, S, SO, $SO_2$, CO, O—CO—O, CO—O, —CH=CH—, —C≡C—, and in which one or more hydrogen atoms is optionally replaced by F, Cl, Br, I or CN, or an aryl, heteroaryl, aryloxy or heteroaryloxy group which has 5 to 40 carbon atoms and is optionally be substituted by one or more non-aromatic $R^{11}$ radicals; in this structure;

n is the same or different at each instance and is 0 or 1;

m is the same or different at each instance and is 0, 1, 2, 3 or 4, with the proviso that at least one index m is not equal to 0, and with the further proviso that neither index m is equal to 0 if both n=0;

with the proviso that at least two of the substituents $R^1$ to $R^4$ are not H when the compound of the formula (1) is a tetrahydropyrene system, and with the proviso that the following compound is excluded from the invention:

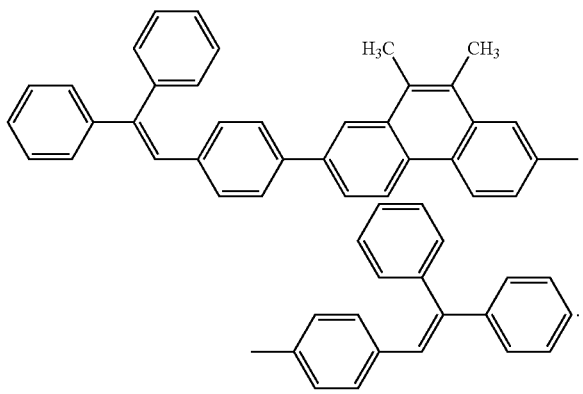

3. The compound according to claim 2, wherein at least one of the substituents Y contains at least one fused polycyclic aromatic ring system or an aza heterocycle.

4. The compound according to claim 2, wherein the compound has a symmetrical structure.

5. The compound according to claim 2, wherein n=0 for the use of the compound as a host material.

6. The compound according to claim 2, wherein at least one n=1 for the use of the compound as an emitting material (dopant), wherein the corresponding m=1, 2, 3 or 4, and that at least one X=—$CR^{11}$— or —C≡C—.

7. The compound according to claim 2, wherein at least one n=1 for the use of the compound as a hole transport material, wherein the corresponding m=1, 2, 3 or 4, and that at least one X=N—Y.

8. The compound according to claim 2, wherein at least one n=1 for the use of the compound as a triplet matrix material, wherein the corresponding m=1, 2, 3 or 4, and that at least one X=C(=O), S(=O), $S(=O)_2$ or P(=O)(Y).

9. The compound according to claim 2, wherein the compound is selected from the structures (1) to (6), (8) to (11), (13)-(16), (19) and (21-23)

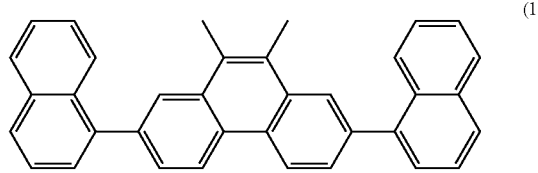

(1)

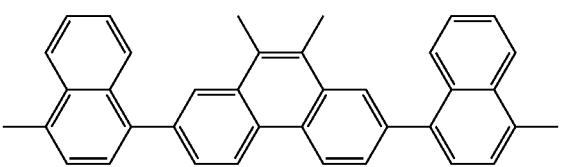

(2)

(3) 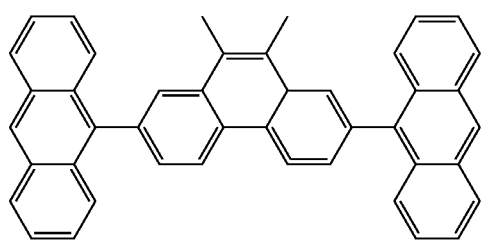
(4) 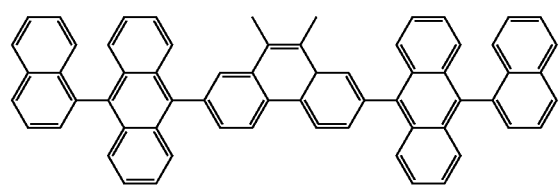
(5) 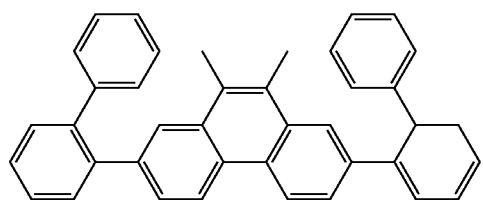
(6) 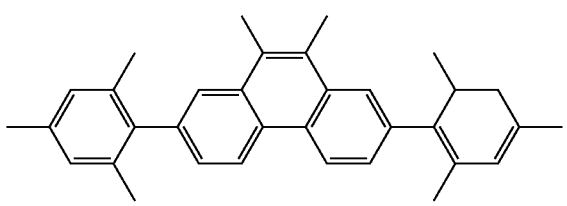
(8) 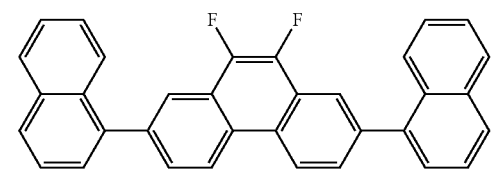
(9) 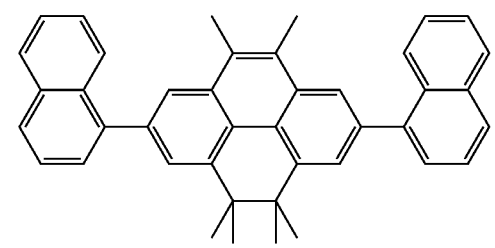
(13) 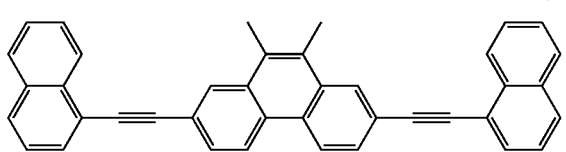
(14) 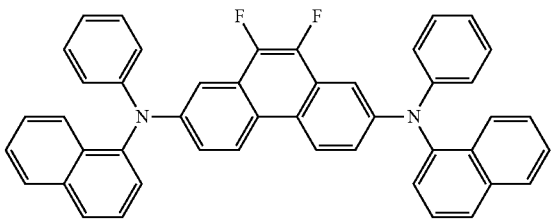
(15) 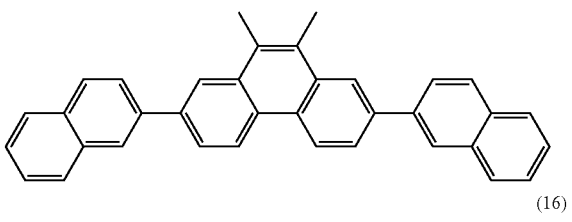
(16) 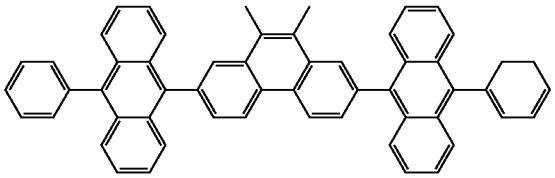
(19) 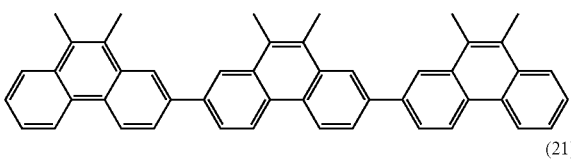
(21) 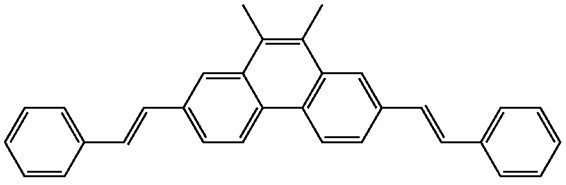
(22) 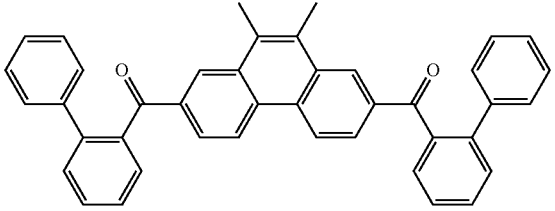
(23) 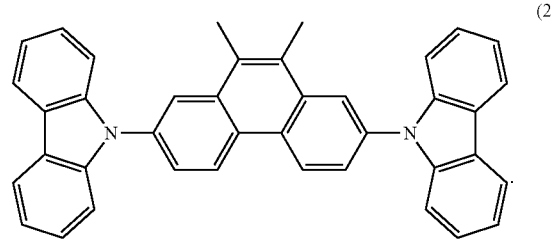
10. A mixture which comprises at least one compound according to claim 2, and a host material or a dopant.
11. An organic electronic device comprising an anode, a cathode and at least one compound according to claim 2.

12. The organic electronic device according to claim 11, wherein the device is an organic electroluminescent device (OLED), an organic field-effect transistor (O-FET), an organic thin-film transistor (O-TFT), an organic integrated circuit (O-IC), an organic solar cell (O-SC), an organic field-quench device (O-FQD), an organic light-emitting transistor (O-LET), a light-emitting electrochemical cell (LEC) or an organic laser diode (O-laser).

13. An organic electroluminescent device comprising the compound according to claim 2 as a host material together with a dopant which can emit light from the singlet or from the triplet state, or as a dopant together with a host material, or as a hole transport material.

14. A mixture which comprises at least one compound according to claim 9, and a host material or a dopant.

15. An organic electronic device comprising an anode, a cathode and at least one compound according to claim 9.

16. The organic electronic device according to claim 15, wherein the device is an organic electroluminescent device (OLED), an organic field-effect transistor (O-FET), an organic thin-film transistor (O-TFT), an organic integrated circuit (O-IC), an organic solar cell (O-SC), an organic field-quench device (O-FQD), an organic light-emitting transistor (O-LET), a light-emitting electrochemical cell (LEC) or an organic laser diode (O-laser).

17. An organic electroluminescent device comprising the compound according to claim 9 as a host material together with a dopant which can emit light from the singlet or from the triplet state, or as a dopant together with a host material, or as a hole transport material.

* * * * *